United States Patent [19]

Palloch et al.

[11] 4,324,448

[45] Apr. 13, 1982

[54] CIRCUIT BOARD WITH PLUG CONNECTOR

[75] Inventors: Herbert Palloch, Schwetzingen; Hans Erndt, Wiesloch, both of Fed. Rep. of Germany

[73] Assignee: Frankl & Kirchner GmbH & Co. KG, Fabrik für Elektromotoren u. elektrische Apparate, Schwetzingen, Fed. Rep. of Germany

[21] Appl. No.: 137,892

[22] Filed: Apr. 7, 1980

[30] Foreign Application Priority Data

Apr. 6, 1979 [DE] Fed. Rep. of Germany ....... 2913937

[51] Int. Cl.[3] ............................................... H05K 1/00

[52] U.S. Cl. ............................... 339/17 C; 339/193 P

[58] Field of Search ........................... 339/17 C, 193 P

[56] References Cited

U.S. PATENT DOCUMENTS 4,012,094 3/1977 Van Renssen .............. 339/193 P X
4,113,342 9/1978 Andreaggi .................... 339/17 C X

FOREIGN PATENT DOCUMENTS 2736169 2/1979 Fed. Rep. of Germany ... 339/193 P

*Primary Examiner*—Joseph H. McGlynn
*Assistant Examiner*—Frank H. McKenzie, Jr.
*Attorney, Agent, or Firm*—Browdy and Neimark

[57] ABSTRACT

A circuit board arrangement which is to be disposed in a housing closable by a cover or hood has a plugged connector, which has plug prongs for effecting electrical connections of circuitry attached to the housing. The plug connector is secured on a rim portion of the circuit board. The plug connector is disposed on the side of the circuit board oriented towards the cover. The plug prongs extend perpendicular to the main plane of the circuit board, plug sockets opening toward an outer face of the plug connector remote from the circuit board. The outer face is located in an opening in the cover. The plug connector is an insulating body substantially L-shaped in cross-section having one free end of the longer L-arm supported on the circuit board and having a shorter L-arm pointing towards the adjacent circuit board rim portion. The plug connector has U-shaped plug prongs extending through its longer L-arm and its shorter L-arm.

12 Claims, 5 Drawing Figures

CIRCUIT BOARD WITH PLUG CONNECTOR

BACKGROUND OF THE INVENTION

1. Field of the Invention

This invention relates to a circuit board with a plug connector having plug prongs for the electrical connection of the circuitry disposed on the circuit board to a coupler member attached to the housing. The invention relates more particularly to a circuit board with a plug connector in which the plug connector is secured at the rim of the circuit board.

2. Prior Art

In conventional circuit board arrangements of the above-mentioned kind having plug connectors, insulating bodies extend along one narrow rim of the circuit board, and the plug prongs extend in the main plane of the circuit board or parallel thereto. Circuit boards equipped with plug connectors of this type are, as a rule, inserted vertically, i.e., on edge, in sleeve couplers which are disposed in the rear portion of a housing for a machine stand or frame. The plug connection here serves not only to effect electrical connections to circuitry embodied on the circuit board to wiring provided in the housing, but also acts as a device for orienting the circuit board relative to the housing, especially in view of the fact that engagement elements for adjustable structural parts, such as a shaft of trimming potentiometers and the like, are frequently disposed on the opposite narrow side of the circuit board. These engagement elements are also disposed parallel to the main plane of the circuit board, so as to be accessible on this protruding end side of the circuit board disposed one beside the other in the machine stand.

It is accordingly a principal object of the invention to provide a circuit board with a plug connector of the type described above in such a manner that the circuit board is placed in the housing in a mechanically shielded manner, even when the housing has been opened, that interference-free electric connections of the circuit board to the wiring located in the housing is assured and furthermore that functionally essential output control lines of the circuitry embodied on the circuit board are accessible from the outside, when the housing is closed, without significantly additional cost either in terms of structure or in terms of assembly techniques.

SUMMARY OF THE INVENTION

The above-mentioned object, as well as others which are to become clear from the text below, is achieved in accordance with the present invention in a circuit board which is to be disposed in a housing closable by a hood or cover and has a plugged connector, which has plug prongs for the electrical connection of the circuitry disposed on the circuit board to a coupling element attached to the housing. The plug connector is secured on the rim of the circuit board. The plug connector is disposed in accordance with the novel aspects of the invention oriented towards the hood or the cover. The plug prongs extend perpendicular to the main plane of the circuit board. Plug sockets open toward the outer face of the plug connector remote from the circuit board, this outer face being located in an adapted opening of the hood or cover.

A plug connector embodied as described above bridges the distance toward the circuit board normally existing between the circuit board and the hood or cover end wall, bridging this distance by way of the height of its insulating body, so as to be able to engage an opening in an end wall. As a result, this end of this insulating body, which does not protrude beyond the end face of the hood or cover, is effectively protected from mechanical damage, while on the other hand the plug sockets disposed in the insulating body and located in output control circuits of the circuitry are accessible from the outside even when the housing is closed by the hood or cover. The arrangement of the circuit board at the desirable level below the junction plane on a support attached to the housing is a question solely of the dimensioning of the height of the insulating body relative to the given axial length of the hood or cover. Thus protruding ends of side walls of the housing, even when the hood or cover has been removed for servicing purposes, represents an acceptable mechanical shielding of the electronic and possibly electromechanical components disposed on the surface of the circuit board oriented towards the hood or cover. The prongs of the plug connector, which have the shape of a U, serve the purpose along with the end of the one arm of electrical and mechanical connection of the plug connector with the circuit board, while the electrical connections to a coupler element carried by the housing for the connection of the wiring extending in the interior of the housing is established via the second U-shaped arm and the circuit board is dropped perpendicular to its main plane through the junction plane of the open housing onto the circuit board attached to the housing. In this manner, a connection possibility for the circuit board, with regard to its mechanical and electrical insertion into the housing, is assured which is functionally reliable and easily accessible and, after the closing of the housing by the hood or cover, an electrical access to the circuitry embodied on the circuit board can be effected by way of the same structural elements passing through the hood or cover.

The circuit board disposed parallel to the junction plane of the housing is on the one hand easily accessible over its entire plane after the removal of the hood or cover for testing and servicing purposes while on the other hand this arrangement above the housing base makes available a large free space in which structural elements of large volume and switching units such as capacitors, transformers and rectifier components can be disposed in a mechanically secure manner. For mechanical reasons, such components are not suitable to be supported by the circuit board itself.

BRIEF DESCRIPTION OF THE DRAWINGS

The invention will be better understood and further objects and advantages thereof will become more apparent from the following detailed description of a preferred embodiment, taken in conjunction with the accompanying drawings; wherein.

DESCRIPTION OF THE PREFERRED EMBODIMENT

Figure 1:
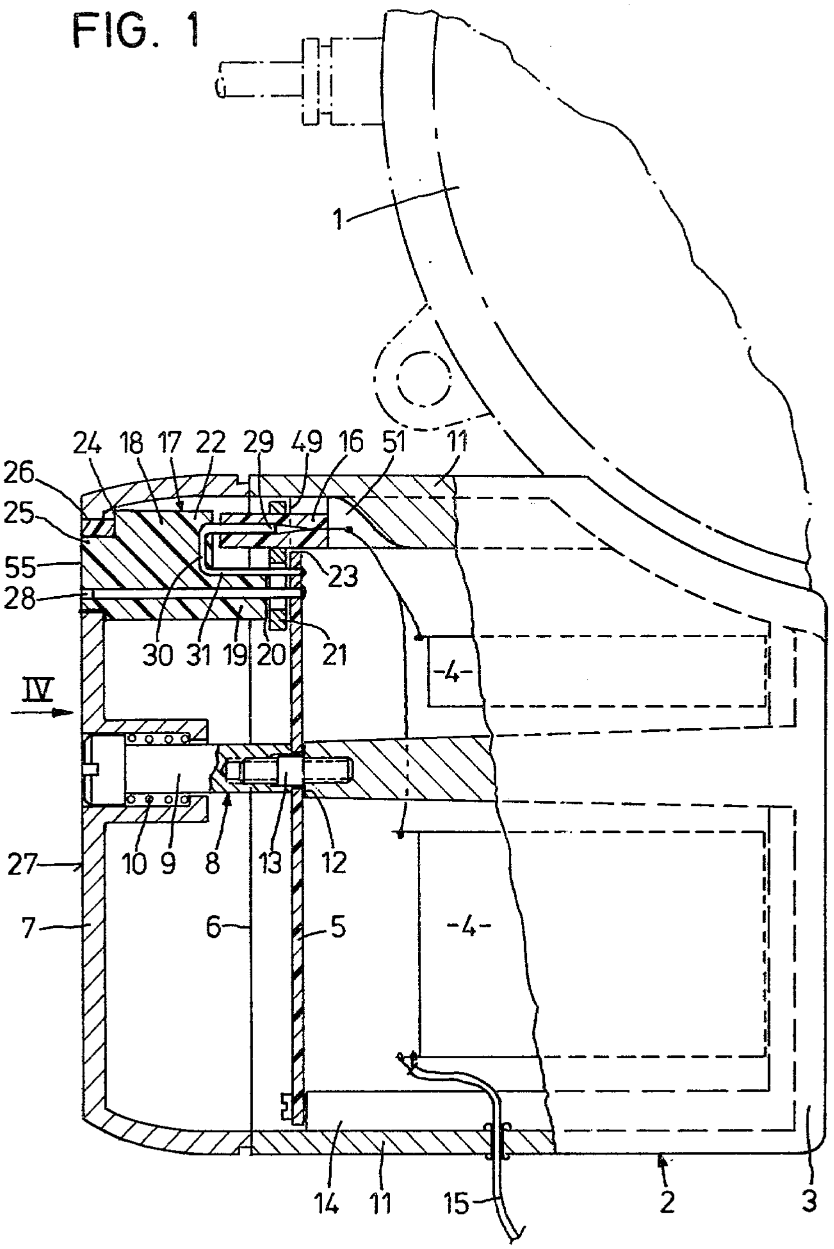
FIG. 1 is a cross-sectional view of a control box, partially cut away, attached to the housing of a positioning electric motor, the control box being operatively associated with a circuit board provided with a plug connector in accordance with the preferred embodiment of the present invention.

Referring to the drawings, a housing generally designated by the numeral 2 of a control box is disposed at the side below an electric motor housing 1, by way of example a positioning drive electric motor for an industrial sewing machine. The control box serves to receive electromechanical or electronic switches and electronic open-loop and closed-loop circuits as well as associated structural components of a power supply and also serves the purpose of electrically interconnecting control devices and utilization devices. Structural elements and circuit units 4 of large volume, such as power transformers, rectifier components and capacitors are disposed on a base 3 of the housing 2. The remaining electronic components and circuit elements are disposed on a printed circuit board 5 having wired-in printed circuitry. The circuit board 5 extends parallel to a junction plane 6 in which the housing 2 can be opened by removal of a hood or cover 7 acting as a cap. The fixing of the hood or cover 7 on the housing 2 is effected by means of a securing device generally designated by numeral 8, whose structure and mode of operation are described in detail in the patent application by applicant of even date, based on German Federal Republic Application P29 13 861.2. When a form-locking connection is established by the hood or cover 7 with the housing 2 by a screwable element 9 in the form of a shaft nut, a helical spring 10 presses the hood or cover 7 in the junction plane 6 against an end face of a side wall 11 of the housing and the circuit board 5 is then pressed against a support 12 attached to the housing. A centering body 13 which protrudes outwardly from this support 12 effects the positioning of the circuit board 5 in both coordinate directions of the main plane of the circuit board, even before the hood or cover 7 is put into place. Thus, after the securing device 8 has been tightened, the circuit board 5 is adjusted and fixed in three dimensions relative to the housing 2 which surrounds it.

In order to increase the stability of the disposition of the circuit board 5 in the housing 2, it can additionally be provided that rim areas of the circuit board 5 are bolted together with end faces of respective strut ribs 14 after an adjustment in position of the main plane of the circuit board 5 by the centering body 13.

Figure 5:
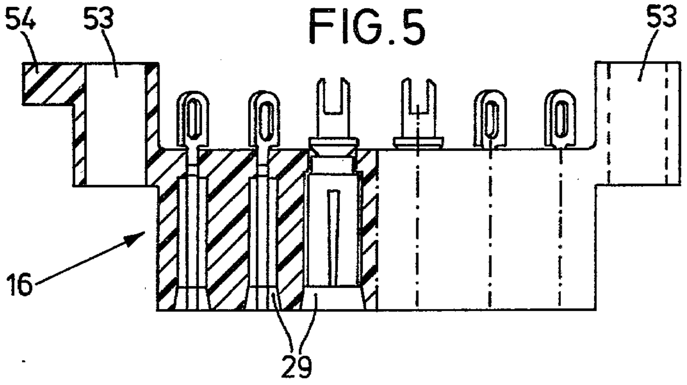
FIG. 5 is a partially cut away side view of a hood or cover which is to be associated with the plug connector and secured on the housing.

The electrical connection of a feeder cable 15 to the circuits on the circuit board 5, which can be effected directly or via the large circuit unit 4 as illustrated, is established via a coupler element 16, shown in detail in FIG. 5, attached to the housing 2 and a plug connector 17 connected both mechanically and electrically to the circuit board 5. This plug connector 17 is secured to a rim on the surface of the circuit board 5 oriented towards the hood or cover 7. The plug connector 17 comprises a substantially L-shaped insulating body 18 whose cross-section extends in the plug direction (FIG. 2), the longer L-arm 19 of which, at its free end 20, is positioned on the circuit board side with the interposition of a cooling plate 21 provided with apertures. A shorter L-arm 22 points towards an adjoining rim 23 of the circuit board 5 and projects beyond it. On the free outer face 24 of the shorter L-arm 22, which extends parallel to the main plane of the circuit board 5, there is an offset, raised element 25. The raised element 25 is drawn upward above the free end 20 of the longer L-arm 19 to such an extent that, at a given height of the hood or cover 7 mounted on the housing 2 relative to the support 12 attached to the housing, it protrudes into an aperture 26, shaped to correspond to the cross-section of this raised element 25, in an end face 27 of the hood or cover 7, compactly adjacent thereto.

Plug sockets 28 extend into the interior of the longer L-arm 19, parallel to the longitudinal extension thereof, and these plug sockets 28 are accessible for plug prongs (not shown in the drawing) in the region of the raised element 25 of the insulating body 18. They are accessible in particular to a connection plug of a coupler and brake coils, controlled by the circuitry on the circuit board 5, of an industrial sewing machine positioning drive.

The electrical connection of the printed circuitry on the underside of the circuit board 5, oriented towards the interior of the housing 2, to a sleeve 29 of the coupler element 16 is effected by U-shaped prongs 30, each having upstanding portions of unequal length. The longer arm 31 of the prong 30 thereof extends along the inner face 32 (see FIG. 2) of the longer L-arm 19 of the insulating body 18. A cross piece 33 of the U-shaped prong 30 extends through the interior of the shorter L-arm 22 and exits near a free end 34 thereof as a shorter U-shaped arm 35 in the direction of the main plane of the circuit board 5. However, the cross piece 33 terminates while still above the main plane of the cooling plate 21. The longer U-shaped arm 31 protrudes freely through the cooling plate 21 and into an aperture 36 in the circuit board 5, so as to be capable of being soldered on the exit side to the circuitry printed there on a circuit board lining. In a comparable manner, soldering lugs 37, which are molded integrally on the inner end of the hollow cylindrical plug sockets 28, protrude through a blind bore base 38 so as to be capable of being connected in like manner, by soldering on the rear of the circuit board 5 therewith, without coming into contact with the cooling plate 21. This is shown in FIG. 1 and, in more detailed form, in FIG. 2. The securing of the U-shaped prongs 30 is assured in that they extend, with one respective part of the arms 31, 35 and with the cross piece 33, within grooves 39, which are embodied in the respective inner faces 32 and 40 of the longer and shorter L-arms 19 and 22, respectively, and into which they can be pushed, with the cross piece 33 at the forefront, from the end 20 of the longer L-arm 19 outward. The U-shaped prongs 30 are fixed within the insulating body 18 in the region of the cross piece 33 by being plugged or tamped by heat-deformed deformation points 41 on a partition 42 between adjacent grooves 39. In an efficient manner, the grooves 39 of differing cross-sections are provided so as to be able to insert U-shaped prongs 30 of different thicknesses in the insulating body 18. As a result, an adaptation of the circuit board cross-section to the electrical load of the individual plug locations can be accomplished, and at the same time, by appropriate distribution of relatively thicker and thinner prongs 30, as best seen in FIG. 3, on the insulating body 18, encoding can be effected. Such encoding prevents a circuit board 5, equipped with a plug connector 17 of this kind, from being associated with a housing 2 which is provided with a differently encoded coupler element 16.

Figure 2:
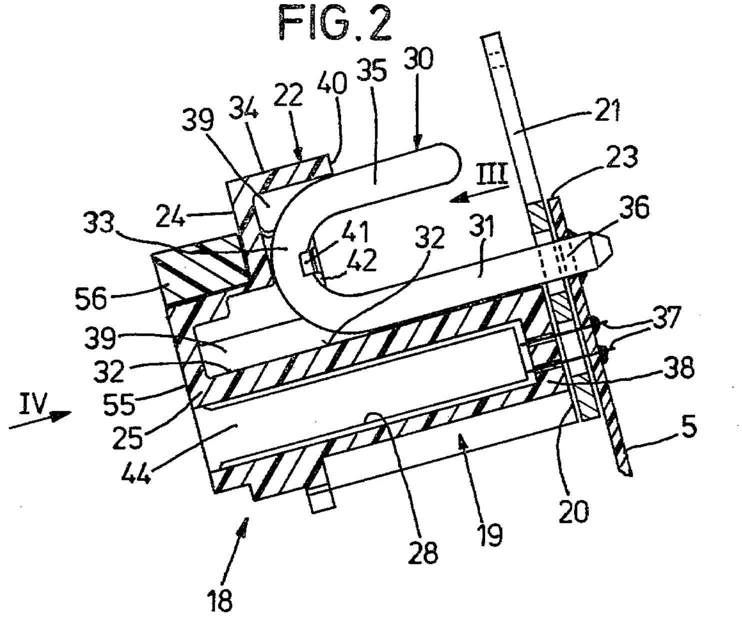
FIG. 2 is a sectional view of the plug connector of FIG. 1, the section having been taken along the section line II—II in FIG. 3.
Figure 3:
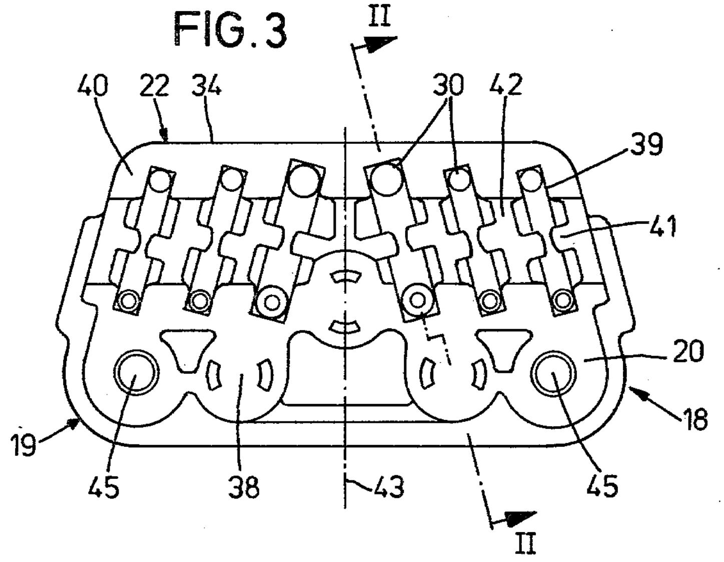
FIG. 3 is a view from below of the plug connector of FIG. 2, the view having been taken in the direction of the arrow III of FIG. 2.

As can be seen from FIG. 2, the insulating body 18 has its free end face 20 of the longer L-arm 19 positioned against the cooling plate 21, the shorter L-arm 22 having its free end face positioned towards the cooling plate 21. It is efficient to direct the grooves 39 extending on the inner face 40 of the shorter L-arm 22 relative to a central transverse line 43, as shown in FIG. 3, in such a manner that in pairs facing one another they represent the short sides of respective trapezoids, whose base sides extend parallel to the end face rim of the outer face 24 of the shorter L-arm 22. The longer base side of these trapezoids thus are located in the region of transition from the shorter L-arm 22 to the longer L-arm 19. This arrangement produces, first, the advantage of the short U-shaped arms 35 being located closely adjacent one another, which results in a coupler element 16 mounted on the housing 2 having a correspondingly shorter lengthwise dimension. Secondly, the ends of the longer U-shaped arms 31 are at great transverse distances from one another and as a result can be soldered to the lined rear side of the circuit board 5 without the danger of forming undesirable conductive bridges.

Between a blind bore 44 for receiving the plug socket 28 and the rim on the narrow side of the insulating body 17, as shown in FIG. 3, two offset bores 45 are provided passing in the longitudinal direction through the longer L-arm 19. As needed, in addition to the soldering of the longer U-arms 31 and the plug socket soldering lugs 37, the plug connector 17 can be secured to the circuit board 5 by threaded bolts (not shown) positioned in hoses 45.

It is true that no positioning of the circuit board 5 relative to the housing 2 takes place by way of the plug connector 17 mounted on the circuit board 5 and the associated coupler element 16 attached to the housing, because for this purpose the centering body 13 is provided, as discussed in connection with FIG. 1. Nevertheless, this arrangement produces a desirable increase in stability of the circuit board 5 itself and of the disposition of the plug connector 17 on the circuit board 5 because the stable cooling plate 21 is disposed in the surrounding area between the plug connector 17 and the circuit board 5. On this cooling plate 21, structural components 46 of the power supply electronics are disposed, whose waste heat is carried away over a large surface area via the cooling plate 21 and a connection rib 47 (see FIG. 4) to the metal housing 2 which acts as a heat sink. The components 46, via short line connections on the lined rear side of the circuit board 5, have switched the prongs 30 or the plug sockets 28 into their respective power circuits. As a result of this direct spatial association of the structural components 46 of the power supply electronics with the connection to the power circuit, it is assured that thermal and/or electric interferences on the remaining elements of the circuitry disposed on the circuit board 5 are virtually precluded. After the circuit board 5 has been positioned in the direction of the extension of its main plane relative to the housing 2 and thus also relative to the housing side walls 11 by virture of its centering body 13, the circuit board 5 can be secured, i.e. bolted on its end face 49, to the rib 47 acting as the thermal connection and also acting as the lateral support for the circuit board, this securing being effected via the laterally protruding cooling plate 21 by machine screws 48.

In a region of the plug connector 17, the portion of the cooling plate 21 which protrudes beyond the rim 23 of the circuit board 5 has a recess 50 which is associated with a recess 51 in the connection rib 47. The extended coupler element 16 is loosely secured to the end face rims of a recess 51, so that during the establishment of the plug connection itself, the coupling element is centered relative to the plug connector 17. To this end, the coupling element 16 is attached to the housing 2 by screws 52, which penetrate apertures 53 having relatively larger diameters than do the screws, so that the coupling elements 16 are secured on the housing 2 in such a manner that they will not be lost, while there is still play on all sides.

As may be seen from FIG. 5, the coupling element 16 has an orientation protrusion 54 on one narrow side, by way of which, given an appropriate shaping on the side of the housing adjacent to the recess 51, a positive orientation of the coupling element 16 is assured. This is of particular significance if a given distribution of prongs 30 of varying thickness is intended to be unequivocally associated with a corresponding distribution of sleeves or sockets 29 of varying diameters for the purpose of the association of particular circuit boards 5 with a particular wiring of the coupler elements 16.

Figure 4:
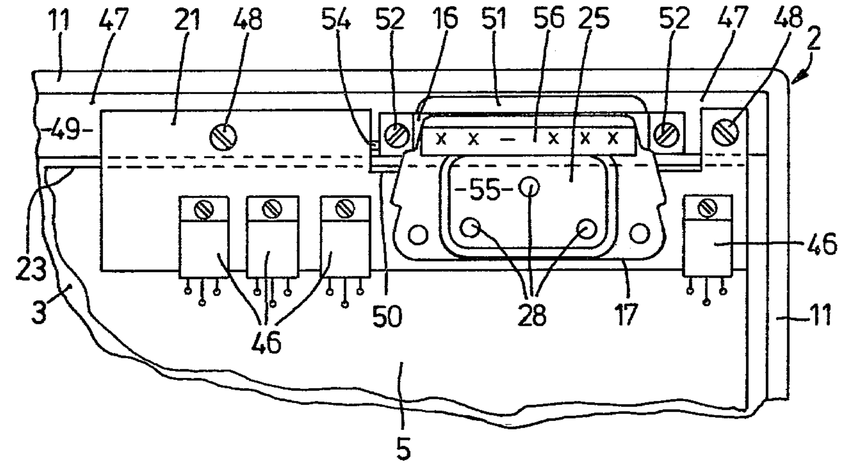
FIG. 4 is an end view of the plug connector and of a circuit board carrying the plug connector in accordance with the present invention, with the circuit board fixed on the housing of the control box, and with the hood or cover removed, the end view having been in the direction of the arrows IV in FIGS. 1 and 2.

As may be appreciated from FIGS. 1, 2 and 4, an information carrier body 56 can be disposed on the outer face 24 of the shorter L-arm 22 beside the raised element 25. This information carrier body 56 is secured in releasable fashion, either by gluing or welding or by a detent connection having its outer face in approximate alignment with the outer face 55. The information carrier body 56 also extends through the appropriately adapted opening 26 in the hood or cover 7. Information as to the content of the box can be disposed on this outer face, having to do with which specific open-loop and closed-loop circuitry has been provided on the circuit board 5 on which the insulating body 18 is secured. This is of particular importance in the case of circuits which are in principle identical but are differently designed in detail and intended for the operation of electromotor positioning drive for industrial sewing machines. Such machines are in use in many variant forms and accordingly must be driven using correspondingly modified circuits. From the information on the information carrier, it can thus always be learned, both when the housing 2 is closed and when the hood or cover 7 has been removed for servicing purposes, whether the circuit board 5 in use at that time in the housing 2 actually is appropriate to the positioning drive motor, which has been specified by the information on the information plaque of the motor housing 1 on which the housing 2 has been mounted.

The foregoing description and accompanying drawings relate to a preferred embodiment set out by way of illustration and not by way of limitation. It is to be appreciated that numerous other embodiments are possible without departing from the spirit and scope of the invention, its scope being defined by the appended claims.

What is claimed is:

1. A circuit board arrangement disposed in a housing closable by a cover, the combination comprising a coupling element attached to the housing, a circuit board having a main planar surface, a plug connector having a plurality of plug prongs for electrical connection of circuitry disposed on the circuit board to said coupling element, the plug connector being secured on a rim portion of the circuit board and on the side of said circuit board oriented towards said cover, said plug connector comprising an insulating body formed with plug sockets in which said plug prongs are respectively mounted, said plug prongs extending substantially perpendicular to said main planar surface of said circuit board, said plug sockets opening towards an outer face of said plug connector remote from said circuit board, and said outer face of said plug connector being located in an opening in said cover.

2. A circuit board arrangement as defined by claim 1, wherein said plug connector is substantially L-shaped in cross section with arms of different lengths and having one free end of the longer arm of said arms supported from said circuit board and having the shorter arm of said arms pointing towards said rim portion of said circuit board.

3. A circuit board arrangement as defined by claim 2, wherein said plug prongs are of U-shape and extend through said longer arm of said arms and said shorter arm of said arms of said connector.

4. A circuit board arrangement as defined by claim 3, wherein said plug prongs U-shaped arms are of differing lengths and only the longer U-shaped are protrudes beyong an end of said longer arm of said insulating body.

5. A circuit board arrangement as defined by claim 2 or 3, wherein one arm of each said plug prongs is fixed along said longer arm of said arms of said insulating body, and including a cross piece fixed along said shorter arm of said arms of said insulating body, a second arm of each said plug prongs being fixed on said insulating body and freely protruding from said shorter arm of said arms of insulating body.

6. A circuit board arrangement as defined by claim 5, wherein said cross piece and respective adjacent areas of said U-shaped arms are disposed in respective grooves formed on respective inner faces of said arms of said insulating body and are secured in a region of said shorter arm of said arms of said insulating body between adjoining grooved partitions.

7. A circuit board as defined by claim 6, wherein said grooves formed on said inner faces of said shorter arm of said insulating body are positioned on a shorter base of respective trapezoids disposed one beside another, and the longer base, of said grooves being formed on said longer arms of said arms of said insulating body.

8. A circuit board arrangement as defined by claim 2 or claim 3, including an apertured cooling plate adjoining and protruding beyond said circuit board rim portion disposed between an end of said longer arm of said insulating body and said circuit board.

9. A circuit board arrangement as defined by claim 8, wherein said cooling plate has a recess aligned with said circuit board rim portion, said recess being slightly longer than the length of that portion of said coupling element attached to said housing with which said plug prongs are in engagement.

10. A circuit board arrangement as defined by claim 2 or claim 3, wherein plug sockets are disposed in blind bores formed in said insulating body and penetrate the base thereof with integrally molded soldering lugs which protrude beyond said free end of said longer arm of said arms of said insulating body.

11. A circuit board arrangement as defined by claim 2 or claim 3, including an information carrier body attached to an outer face of said shorter arm of said arms of said insulating body, an outer face of which information carrier body is approximately in alignment with said outer face of said plug connector and is located in a corresponding opening in said cover.

12. A circuit board arrangement according to claim 11, wherein said information carrier body is releasably attached to said outer face of said shorter arm.

* * * * *